United States Patent
Byun et al.

(10) Patent No.: US 10,504,655 B2
(45) Date of Patent: Dec. 10, 2019

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Man Su Byun, Suwon-si (KR); Ho Yoon Kim, Suwon-si (KR); Dae Heon Jeong, Suwon-si (KR); Kyung Hwa Yu, Suwon-si (KR); Min Kyoung Cheon, Suwon-si (KR); Soo Hwan Son, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 206 days.

(21) Appl. No.: 15/644,178

(22) Filed: Jul. 7, 2017

(65) Prior Publication Data

US 2018/0182558 A1    Jun. 28, 2018

(30) Foreign Application Priority Data

Dec. 22, 2016  (KR) .................. 10-2016-0176313

(51) Int. Cl.
*H01G 4/40*   (2006.01)
*H01G 4/30*   (2006.01)
(Continued)

(52) U.S. Cl.
CPC ............. *H01G 4/40* (2013.01); *H01G 2/065* (2013.01); *H01G 4/012* (2013.01); *H01G 4/232* (2013.01);
(Continued)

(58) Field of Classification Search
CPC ........... H01G 4/232; H01G 4/40; H01G 2/14; H01G 4/30; H02H 9/04–046
See application file for complete search history.

(56) References Cited

U.S. PATENT DOCUMENTS 6,515,556 B1 *  2/2003  Kato ..................... H01P 5/10
                                                        333/116
6,768,410 B1 *  7/2004  Yazaki ............... H01F 17/0013
                                                        333/25
(Continued)

FOREIGN PATENT DOCUMENTS

JP        2000-114005 A       4/2000
KR    10-2015-0135909 A      12/2015
KR      10-1578544 B1        12/2015

*Primary Examiner* — Ronald W Leja
*Assistant Examiner* — Christopher J Clark
(74) *Attorney, Agent, or Firm* — Morgan, Lewis & Bockius LLP

(57) ABSTRACT

The composite electronic component includes: the capacitor including a body in which a plurality of dielectric layers and internal electrodes facing each other, with the dielectric layer interposed therebetween, are stacked, and the ESD protection device including first and second lead electrodes disposed on the body of the capacitor, a discharge part disposed between the first and second lead electrodes, and a protection layer disposed on the first and second lead electrodes and the discharge part; an input terminal connected to the internal electrode of the capacitor and the first lead electrode of the ESD protection device; and a ground terminal connected to the internal electrode of the capacitor and the second lead electrode of the ESD protection device. $G2/G1 < 4.0$ is satisfied, in which $G1$ is a distance between the internal electrodes adjacent to each other and $G2$ is a distance between the first and second lead electrodes.

11 Claims, 4 Drawing Sheets

(51) Int. Cl.
| | |
|---|---|
| H02H 9/04 | (2006.01) |
| H01G 4/232 | (2006.01) |
| H01G 4/248 | (2006.01) |
| H05K 1/18 | (2006.01) |
| H05K 1/11 | (2006.01) |
| H01G 4/012 | (2006.01) |
| H01G 2/06 | (2006.01) |
| H01L 23/00 | (2006.01) |
| H05K 1/02 | (2006.01) |
| H01G 4/12 | (2006.01) |
| H01G 4/008 | (2006.01) |
| H01G 4/33 | (2006.01) |
| H01L 23/60 | (2006.01) |

(52) U.S. Cl.
CPC .............. *H01G 4/248* (2013.01); *H01G 4/30* (2013.01); *H01L 24/16* (2013.01); *H02H 9/045* (2013.01); *H05K 1/0213* (2013.01); *H05K 1/0259* (2013.01); *H05K 1/111* (2013.01); *H05K 1/113* (2013.01); *H05K 1/181* (2013.01); *H01G 4/008* (2013.01); *H01G 4/1227* (2013.01); *H01G 4/33* (2013.01); *H01L 23/60* (2013.01); *H01L 2224/16235* (2013.01); *H01L 2924/15311* (2013.01); *H05K 2201/10015* (2013.01); *H05K 2201/10515* (2013.01); *H05K 2201/10734* (2013.01); *Y02P 70/611* (2015.11)

(56) References Cited

U.S. PATENT DOCUMENTS

| | | | |
|---|---|---|---|
| 10,043,613 B2* | 8/2018 | Kim | H01G 4/30 |
| 10,102,971 B2* | 10/2018 | Ando | H01G 4/002 |
| 10,141,116 B2* | 11/2018 | Hattori | H01G 2/06 |
| 10,170,242 B2* | 1/2019 | Kim | H01G 2/14 |
| 10,242,794 B2* | 3/2019 | Kim | H01F 27/402 |
| 2010/0157505 A1* | 6/2010 | Feichtinger | H01G 4/30 |
| | | | 361/301.4 |
| 2012/0152604 A1* | 6/2012 | Ahn | H01G 2/065 |
| | | | 174/260 |
| 2015/0340154 A1* | 11/2015 | Kim | H01G 2/14 |
| | | | 174/260 |
| 2016/0049244 A1* | 2/2016 | Kitano | H01G 4/1209 |
| | | | 361/301.4 |
| 2016/0149397 A1* | 5/2016 | Kim | H04M 1/026 |
| | | | 307/326 |
| 2017/0236640 A1* | 8/2017 | Kim | H01G 2/14 |
| | | | 361/220 |
| 2017/0244756 A1* | 8/2017 | Bartley | G06F 13/4068 |
| 2018/0124904 A1* | 5/2018 | Cho | H01G 4/002 |
| 2018/0137979 A1* | 5/2018 | Kim | H01G 4/30 |

* cited by examiner

COMPOSITE ELECTRONIC COMPONENT AND BOARD HAVING THE SAME

CROSS-REFERENCE TO RELATED APPLICATION(S)

This application claims benefit of priority to Korean Patent Application No. 10-2016-0176313 filed on Dec. 22, 2016 in the Korean Intellectual Property Office, the disclosure of which is incorporated herein by reference in its entirety.

TECHNICAL FIELD

The present disclosure relates to a composite electronic component and a board having the same.

BACKGROUND

Recently, due to rapid development of the semiconductor industry, ultra-high integration, for miniaturization and high performance, has been pursued, such that it is difficult to prepare a sufficient countermeasure against electrostatic electricity in an integrated circuit (IC).

Accordingly, there is an increasing need to apply an electrostatic discharge (ESD) protection device to a power supply and signal input terminals of the IC.

In addition, a transfer speed of data in portable products such as portable telephones, digital cameras and PDAs, high-speed data lines, USB, and HDMI, and the like, is getting faster, such that a countermeasure against the ESD has become more important.

Further, a connecting cable between boards and a connector connected to an external port are necessary in a product constituting an electronic board having various functions such as a car, a TV, and the like. This part is a part that is capable of being easily contacted by a process or an operator and a user, such that countermeasures against noise and electrostatic electricity are very important for reliability of the product.

In the related art, as components for preventing the ESD, a multilayer ceramic capacitor (MLCC), a transient voltage suppression (TVS) diode, a varistor, an electrostatic discharge (ESD) suppressor, or the like have been used alone or have been used by being connected in parallel.

In this case, an area in which the components of an electronic device are disposed is inevitably increased, which may cause limitation in the miniaturization of the electronic device.

In addition, it is very rare that the components, other than an MLCC, are applied singly, except for an ultra-high frequency communication terminal, since it is difficult to secure electrical characteristics, including inherent noise filter characteristics, of the MLCC.

In addition, when the electronic device is charged, a high voltage induced from an adapter is formed between a PCB ground of a smartphone and a case of the smartphone.

At this time, when a case of the electronic device is formed of a metal, a short circuit may occur between the PCB ground and the case, causing a failure to secure antenna characteristics, which may cause an electric shock accident.

The ESD may be used to prevent the electric shock accident.

However, in the case of a multilayer capacitor, ESD introduced from the metal case may damage the multilayer capacitor, such that a stronger ESD durability has been demanded in the multilayer capacitor.

SUMMARY

An aspect of the present disclosure may provide a composite electronic component in which a component mounted area may be reduced while using electrostatic discharge (ESD), and a board having the same.

According to an aspect of the present disclosure, a composite electronic component may include: a composite body in which a capacitor and an electrostatic discharge (ESD) protection device are coupled to each other, the capacitor including a body in which a plurality of dielectric layers and internal electrodes facing each other, with the dielectric layers interposed therebetween, are stacked, and the ESD protection device including first and second lead electrodes disposed on the body of the capacitor, a discharge part disposed between the first and second lead electrodes, and a protection layer disposed on the first and second lead electrodes and the discharge part; an input terminal connected to the internal electrodes of the capacitor and the first lead electrode of the ESD protection device; and a ground terminal connected to the internal electrodes of the capacitor and the second lead electrode of the ESD protection device. G2/G1<4.0 is satisfied, in which G1 is a distance between the internal electrodes adjacent to each other and G2 is a distance between the first and second lead electrodes.

According to another aspect of the present disclosure, a board having a composite electronic component may include: a circuit board having a plurality of electrode pads formed on an upper part thereof; the composite electronic component, as described above, mounted on the circuit board; and a solder connecting the electrode pads and the composite electronic component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments of the present disclosure will be described in detail with reference to the accompanying drawings.

Composite Electronic Component

Preferable exemplary embodiments of the present disclosure will now be described in detail with reference to the accompanying drawings.

Figure 1:
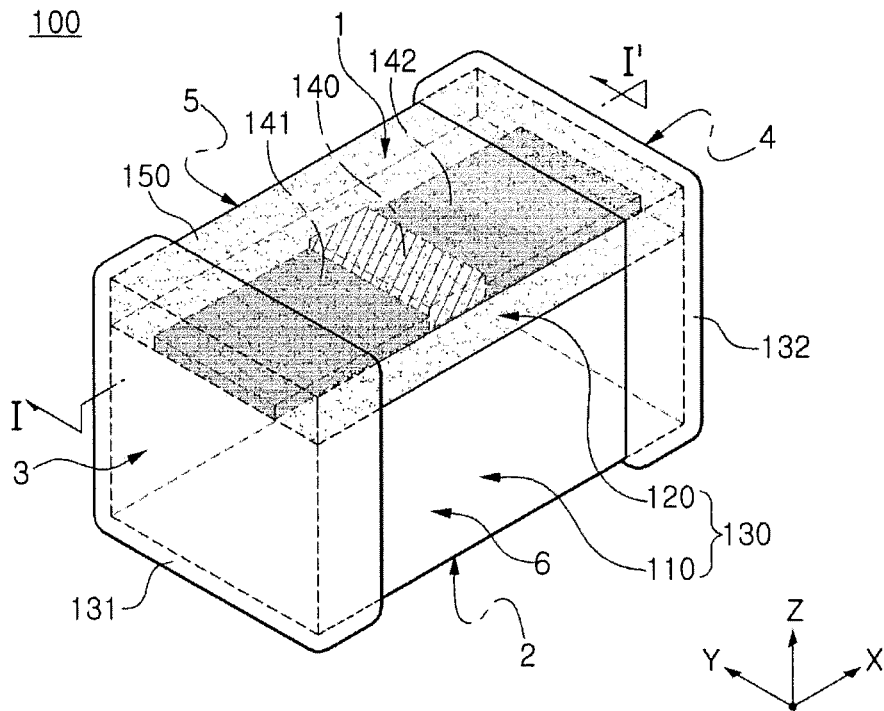
FIG. 1 is a transparent perspective view schematically illustrating a composite electronic component according to a first exemplary embodiment of the present disclosure.
Figure 2:
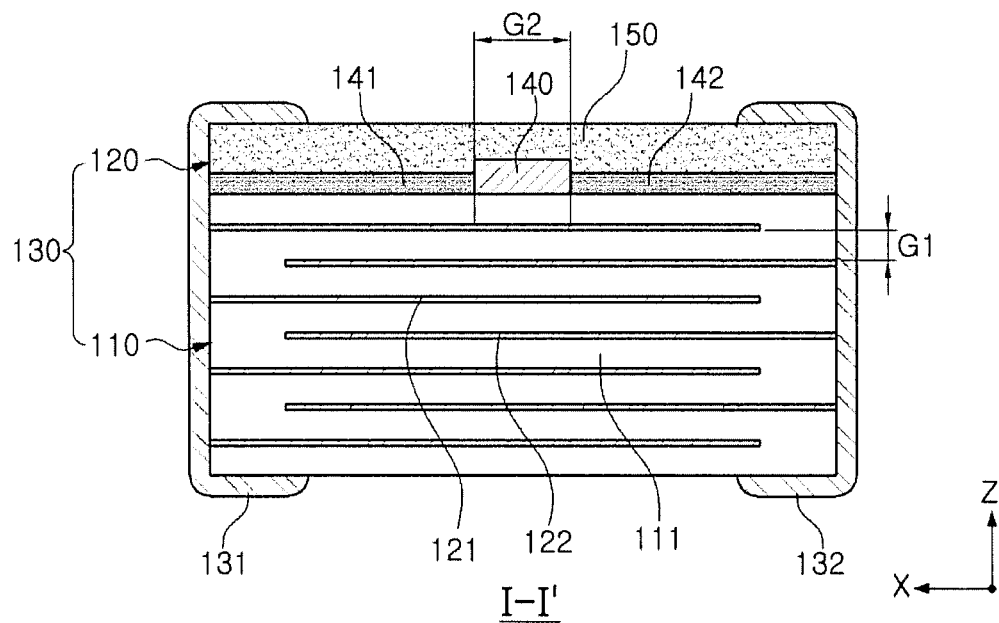
FIG. 2 is a cross-sectional view taken along line I-I' of FIG. 1.

FIG. 1 is a transparent perspective view schematically illustrating a composite electronic component according to a first exemplary embodiment of the present disclosure, and FIG. 2 is a cross-sectional view taken along line I-I' of FIG. 1.

Referring to FIG. 1, in the composite electronic component according to an exemplary embodiment of the present disclosure, a 'length direction' refers to an 'X' direction of FIG. 1, a 'width direction' refers to a 'Y' direction of FIG. 1, and a 'thickness direction' refers to a 'Z' direction of FIG. 1.

Here, the 'thickness direction' refers to a direction in which dielectric layers of a capacitor are stacked, or a 'stacked direction'.

Meanwhile, the length direction, the width direction, and the thickness direction of the composite electronic component are the same as those of a capacitor and an electrostatic discharge (ESD) protection device described below.

In addition, in an exemplary embodiment of the present disclosure, a shape of the composite electronic component is not particularly limited, but may be a hexahedral shape, as shown.

Here, the composite electronic component may include first and second surfaces (1 and 2) opposing each other in the Z direction, third and fourth surfaces (3 and 4) connected to the first and second surfaces (1 and 2) and opposing each other in the X direction, and fifth and sixth surfaces (5 and 6) connected to the first and second surfaces (1 and 2) connected to the third and fourth surfaces (3 and 4) and opposing each other in the Y direction.

Further, the third to sixth surfaces of the composite electronic component are defined as surfaces disposed in the same direction as the third to sixth surfaces of the capacitor and the electrostatic discharge (ESD) protection device, as described below.

Meanwhile, the composite electronic component has a form in which the capacitor and the ESD protection device are coupled to each other. When the ESD protection device is coupled to a lower part of the capacitor, an upper surface of the composite electronic component may be defined as an upper surface of the capacitor, and a lower surface of the composite electronic component may be defined as a lower surface of the ESD protection device.

Referring to FIGS. 1 and 2, the composite electronic component 100 according to a first exemplary embodiment of the present disclosure may include a composite body 130, in which a capacitor 110 and an electrostatic discharge (ESD) protection device 120 are coupled to each other, the capacitor 110 including a body in which a plurality of dielectric layers 111 and internal electrodes 121 and 122 facing each other, with the dielectric layer 111 interposed therebetween, are stacked, and the ESD protection device 120, including first and second lead electrodes 141 and 142 disposed on the body, a discharge part 140 disposed between the first and second lead electrodes 141 and 142, and a protection layer 150 disposed on the first and second lead electrodes 141 and 142 and the discharge part 140.

In the present exemplary embodiment, the composite body 130 may be formed by coupling the capacitor 110 and the ESD protection device 120 to each other. However, a method for forming the composite body 130 is not particularly limited.

For example, the composite body 130 may be formed by coupling the capacitor 110 and the electrostatic discharge (ESD) protection device 120 that are manufactured separately, by using a conductive adhesive, a resin, or the like. The first and second lead electrodes 141 and 142, the discharge part 140, and the protection layer 150 may be formed sequentially on the body constituting the capacitor 110, but the formation thereof is not particularly limited.

According to the first exemplary embodiment of the present disclosure, the first and second lead electrodes 141 and 142, the discharge part 140, and the protection layer 150 may be disposed sequentially on the body constituting the capacitor 110, to form the composite body 130.

Hereinafter, the capacitor 110 and the electrostatic discharge (ESD) protection device 120 constituting the composite body 130 are described in detail.

The body constituting the capacitor 110 may be formed by stacking a plurality of dielectric layers 111. In the body, a plurality of internal electrodes 121 and 122 (sequentially, first and second internal electrodes) may be disposed separately from each other, with the dielectric layer 111 interposed therebetween.

The plurality of dielectric layers 111 constituting the body is in a sintered state and may be integrated so as not to confirm a boundary between dielectric layers 111 adjacent to each other.

The dielectric layer 111 may be formed by firing a ceramic green sheet containing a ceramic powder, an organic solvent, and an organic binder.

The ceramic powder may be a material having a high dielectric constant and may use, for example, a barium titanate ($BaTiO_3$)-based material, a strontium titanate ($SrTiO_3$)-based material, and the like, but the ceramic powder is not limited thereto.

Meanwhile, according to the first exemplary embodiment of the present disclosure, the internal electrodes may include first internal electrodes 121 exposed to the third surface 3 of the composite body 130, and second internal electrodes 122 exposed to the fourth surface 4 of the composite body 130, but are not necessarily limited thereto.

The first and second internal electrode 121 and 122 may be formed by a conductive paste containing a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layer 111 using the conductive paste, through a printing method such as a screen printing method or a gravure printing method.

In addition, the ceramic green sheets on which the internal electrodes are printed may be alternately stacked and fired to form the body.

The capacitor in the present exemplary embodiment may serve to filter a low frequency noise component in a signal interface, an IC block, or a communication line.

According to the first exemplary embodiment of the present disclosure, the ESD protection device 120 may be formed by disposing the first and second lead electrodes 141 and 142, the discharge part 140, and the protection layer 150 on the body constituting the capacitor 110, sequentially.

In general, as components for preventing ESD, a multilayer ceramic capacitor (MLCC) or an electrostatic discharge (ESD) suppressor, or the like, have been used alone or have been used by being connected in parallel.

However, according to the first exemplary embodiment of the present disclosure, the composite electronic component 100 is a component in which the capacitor 110 and the electrostatic discharge (ESD) protection device 120 are coupled to each other.

The ESD protection device 120 may be the ESD suppressor, but is not necessarily limited thereto.

Since the ESD protection device 120, according to an exemplary embodiment of the present disclosure, is the ESD suppressor, the ESD protection device 120 has differences from a varistor, in terms of structure and action, for the following reasons.

According to the first exemplary embodiment of the present disclosure, the first and second lead electrodes 141 and 142 may face each other on the same plane.

The varistor, as a general electrical overstress (EOS) protection device, includes zinc oxide as a raw material, and has a form in which palladium (Pd) electrodes or silver (Ag) electrodes are stacked to face each other in a stacked direction, with the zinc oxide interposed therebetween.

However, according to the first exemplary embodiment of the present disclosure, the first and second lead electrodes 141 and 142 may face each other on the same plane.

This disposition is not necessarily limited thereto, and portions of the first and second lead electrodes 141 and 142 may face each other in the Z direction of the composite body 130.

The first and second lead electrodes 141 and 142 may be formed by a conductive paste including a conductive metal.

The conductive metal may be nickel (Ni), copper (Cu), palladium (Pd), or alloys thereof, but is not limited thereto.

The first and second lead electrodes 141 and 142 may be printed on the body using the conductive paste, through a printing method such as a screen printing method or a gravure printing method.

The discharge part 140 may include a conductive polymer, but is not necessarily limited thereto.

The conductive polymer may have characteristics of a nonconductor when a signal voltage input from a signal interface, an IC block, or a communication line of a power supply terminal, to which a signal is transmitted from a connector to a system or an integrated circuit (IC), is at a rated voltage (circuit voltage) level, but may have characteristics of a conductor when overvoltages such as ESD, and the like, occur instantaneously.

The first and second lead electrodes 141 and 142 may be short-circuited to each other, due to the discharge part 140 having the characteristics of the conductor when the overvoltages such as the ESD, and the like, occur.

Thus, the overvoltages such as the ESD, and the like, may be bypassed to the ground through the ESD protection device 120, such that the signal interface, the IC block or the communication line may be protected.

The conductive polymer is not particularly limited, but may be, for example, a silicone-based resin.

According to the first exemplary embodiment of the present disclosure, since the discharge part 140 includes the conductive polymer which is the silicone-based resin, the electrostatic discharge (ESD) protection device 120 may be coupled to an external surface of the capacitor 110, and may not be disposed inside the capacitor 110.

This is due to the fact that the silicone-based resin has a boiling point much lower than a firing temperature of the body required when the capacitor is manufactured, such that the silicone-based resin may be evaporated and removed when it is disposed inside the capacitor.

In addition, according to the first exemplary embodiment of the present disclosure, the ESD protection device 120 may bypass the overvoltage such as the ESD, and the like, by the first and second lead electrodes 141 and 142 and the discharge part 140 disposed between the first and second lead electrodes 141 and 142. However, the varistor may act as an insulator for the rated voltage when the overvoltages occur, and the varistor may act as a variable resistor to bypass the overvoltages.

The protection layer 150 may protect the first and second lead electrodes 141 and 142 and the discharge part 140 disposed therebetween from an external environment in the electrostatic discharge (ESD) protection device 120, and materials thereof are not particularly limited.

According to the first exemplary embodiment of the present disclosure, the protection layer 150 may include an epoxy-based resin.

The protection layer 150 may include the epoxy-based resin, such that the first and second lead electrodes 141 and 142 and the discharge part 140 disposed therebetween may be protected from the external environment.

In addition, in the present exemplary embodiment, the protection layer 150 may be necessary to protect the device from the external environment since the ESD protection device 120 is coupled to the external surface of the capacitor 110.

The composite electronic component 100 according to the first exemplary embodiment of the present disclosure may include an input terminal 131 disposed on the third surface 3 of the composite body 130 and connected to the first internal electrode 121 of the capacitor 110 and the first lead electrode 141 of the ESD protection device 120, and a ground terminal 132 formed on the fourth surface 4 of the composite body 130 and connected to the second internal electrode 122 of the capacitor 110 and the second lead electrode 142 of the ESD protection device 120.

The input terminal 131 may extend from the third surface 3 of the composite body 130 to a portion of the first surface 1 of the body and a portion of the second surface 2 of the protection layer 150.

The ground terminal 132 may extend from the fourth surface 4 of the composite body 130 to a portion of the first surface 1 of the body and a portion of the second surface 2 of the protection layer 150.

The input terminal 131 and the ground terminal 132 may be connected to the first and second internal electrodes 121 and 122 of the capacitor 110, respectively, and the composite electronic component 100 may serve to filter a noise component of an input signal.

Further, when the input terminal 131 and the ground terminal 132 are connected to the first and second lead electrodes 141 and 142 of the electrostatic discharge (ESD) protection device 120, the composite electronic component 100 may bypass an overvoltage of the rated voltage or more.

The input terminal 131 and the ground terminal 132 may be formed by a conductive paste containing a conductive metal.

The conductive metal may be nickel (Ni), copper (Cu), tin (Sn), or alloys thereof, but is not limited thereto.

Further, the conductive paste may also contain an insulating material. The insulating material may be, for example, glass, but is not limited thereto.

In addition, a method for forming the input terminal 131 and the ground terminal 132 is not particularly limited, and the input terminal 131 and the ground terminal 132 may be formed by dipping the composite body, but may also be formed by using other methods such as plating, and the like.

Further, although not shown in the drawings, a nickel/tin (Ni/Sn) plating layer may be further disposed on an outer side of the input terminal 131 and the ground terminal 132 by plating.

In order to meet consumers' demands, manufacturers of electronic devices persevere in their efforts to decrease a size of a printed circuit board (PCB) provided in the electronic device.

Therefore, an integrated circuit (IC) mounted on the PCB has been demanded to have an increased integration. According to the exemplary embodiment of the present disclosure, this requirement may be satisfied by constituting a plurality of devices into one composite component.

Further, according to the exemplary embodiment of the present disclosure, by implementing two components (the capacitor and the ESD protection device) into one composite electronic component, a degree of integration of elements may be improved, to reduce a mounted area on the PCB.

In the present exemplary embodiment, an effect of reducing the mounted area by 50% or more may be expected, as compared to electronic components in which two components are separated, according to the related art.

Further, the composite electronic component according to the exemplary embodiment of the present disclosure may be used for a high-speed data line, USB 3.0 or higher, HDMI, and the like. In products constituting an electronic board having various functions such as a car and a TV, and the like, the composite electronic component may be used in a connecting cable between boards and an external port.

Since the application has a high data transmission speed and a significantly high reaction speed, and also has a high frequency band, the ESD protection device is required to be a component suitable for the application.

That is, in the composite electronic component according to the exemplary embodiment of the present disclosure, the ESD protection device may be the ESD suppressor usable with the high-speed data line, the USB 3.0 or higher, the HDMI, and the external port having a high data transmission speed, a significantly high reaction speed, and a high frequency band.

Meanwhile, a turn-on voltage when ESD flows may differ according to a spaced distance between the first and second lead electrodes 141 and 142, and a current flowing in the capacitor may have a serious influence on the electronic component, depending on predetermined conditions.

Here, the turn-on voltage refers to a voltage through which high-voltage static electricity flows to the lead electrode by operating the ESD protection device.

A degree to which the ESD maintains a current applied to the capacitor may be correlated with a distance between the internal electrodes of the capacitor when the high voltage current does not flow to the lead electrode but when the current flows to the electronic component.

When a leakage current (LC) occurs in the current flowing through the lead electrode, a new electric field is formed in the internal electrode of the electronic component.

The leakage current is a current when a portion of the current flowing through the lead electrode flows to the internal electrode of the electronic component.

When the distance between the internal electrodes does not hold force applied by the leakage current, damage such as cracks, or the like, may occur in the capacitor.

Here, when a distance between the first and second internal electrodes adjacent to each other in the Z direction of the capacitor is defined as G1, durability of the capacitor proportionally becomes larger as G1 becomes larger.

That is, as the distance between the internal electrodes is increased, insulation resistance and breakdown voltage of the capacitor are increased.

According to a simple formula based on this description, m×G1>LC. In order for the distance between the internal electrodes to hold the effect of the LC, G1 is required to be a predetermined value or higher, and the G1 value satisfying this value is described below.

Here, m is a unit correction constant, and a constant that corrects a dimension between the distance of the internal electrodes and the leakage current that may not be damaged by the LC.

Further, when a distance between the lead electrodes is defined as G2, LC∝G2, and TOV=k×G2, wherein TOV is turn-on voltage, and k is a proportional constant.

In order to obtain a constant TOV, G2 in a predetermined value is accompanied by a current flowing toward the electronic component that is generated in ESD durability-enhanced electronic components. That is, the leakage current inevitably occurs.

According to the combination of these equations, G2 may be proportional to the TOV and the LC, and when the LC occurs, the significantly reduced value of G1, which may protect the capacitor, may vary in magnitude, depending on the value of G2.

That is, when G2/G1 is less than the predetermined constant, as shown in Equation (1) below, the ESD durability-enhanced capacitor may function positively without any damage to the capacitor.

$$G2/G1 < (TOV/k)/(LC/m) \therefore \quad \text{[Equation 1]}$$
$$(TOV/k)/((TOV*1)/m) \therefore$$
$$m/(k \times 1)\frac{G1}{G2} < \frac{\frac{TOV}{k}}{\frac{LC}{m}} = \frac{\frac{TOV}{k}}{\frac{TOV \times l}{m}} = \frac{m}{k \times l}$$

G2/G1<n×m (m: unit correction constant, n: dimensionless constant. reciprocal of k×1)

Therefore, referring to Equation 1 and the description thereof, in the present exemplary embodiment, G2/G1<4.0. When the numerical range is satisfied, ESD durability may be enhanced, and damage to the electronic components may not occur. Further, more preferably, 0.2<G2/G1<4.0.

Experimental Example

Figure 6A:
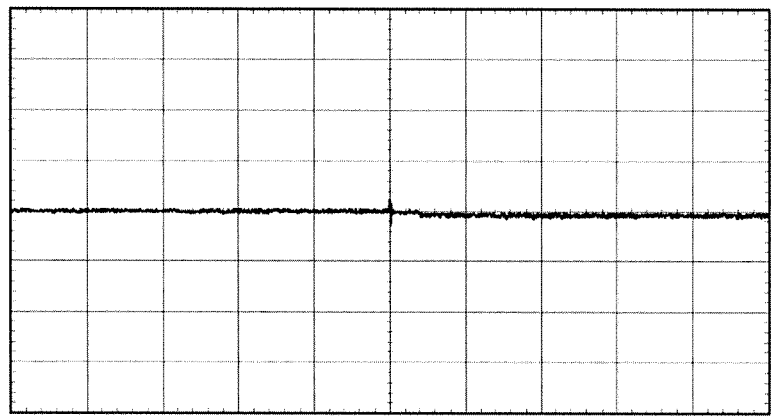
FIG. 6A is a graph illustrating voltage waveforms of a multilayer capacitor when turn-on is normally performed, using an electrostatic discharge (ESD) protection device.
Figure 6B:
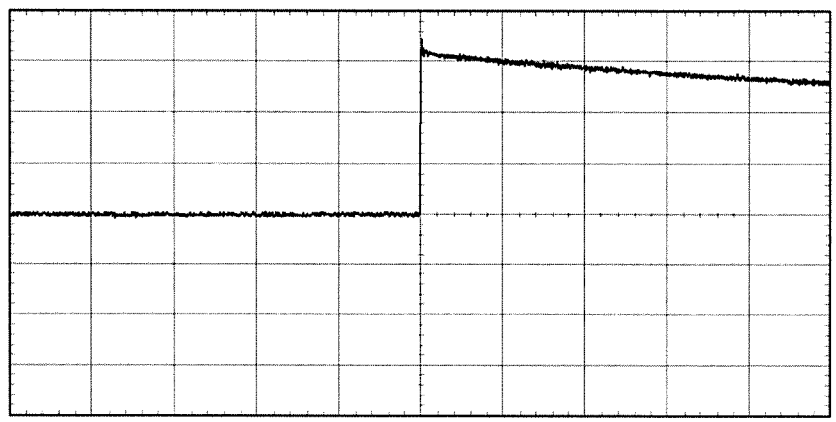
FIG. 6B is a graph illustrating voltage waveforms of the multilayer capacitor when turn-on is not performed normally, using the electrostatic discharge (ESD) protection device.

FIG. 6A is a graph illustrating voltage waveforms of a multilayer capacitor when turn-on is normally performed using an electrostatic discharge (ESD) protection device, and FIG. 6B is a graph illustrating voltage waveforms of the multilayer capacitor when turn-on is not normally performed using the electrostatic discharge (ESD) protection device.

In FIGS. 6A and 6B, an X axis indicates time (20 μs/div) and a Y axis indicates voltage (500 V/div).

Referring to FIG. 6A, there was an instantaneous peak of 1 μs or less in the early stage, but thereafter, a waveform was flat and the ESD absorber functioned positively. Referring to FIG. 6B, the ESD absorber did not absorb the static electricity, and thus a high voltage was continuously applied to the multilayer capacitor, such that the voltage waveform of 1 to 2 kV was maintained, to increase the possibility that the multilayer capacitor would be destroyed.

In the present experimental example, when the TOV was 1000V or more, the electric shock protection function was considered to be almost completely ineffective, such that an experimental region was set to less than 1000V.

The reason for this is that when the TOV was 1000V or more, a voltage higher than 1000V could be applied to the MLCC, which could have a catastrophic effect on the capacitor, when considering a BDV of general capacitors.

Thus, the ESD protector is preferably capable of absorbing static electricity even at a voltage lower than 1000V, and the TOV is preferably less than 1000V.

Table 1 below shows the turn-on voltage and whether damage occurs, according to changes of G1 and G2 in a product having a 1005 size capacitor.

Here, whether the damage occurs in the MLCC was confirmed by applying 10 kV 300 times.

Experiments were performed with 20 samples for each case. G2 and TOV were shown with average values. A case where the number of damaged samples was 10% or more was marked with "0". A case where the number of damaged samples was less than 10% was marked with "X".

TABLE 1

| # | G1 (μm) | G2 (μm) | G2/G1 | Turn On Voltage (V) | Whether damage occurs |
|---|---------|---------|-------|---------------------|----------------------|
| 1 | 10 | 28 | 2.8 | 720 | X |
| 2 | 10 | 39 | 3.9 | 862 | X |
| 3 | 10 | 62 | 6.2 | More than 1000 V | ○ |
| 4 | 15 | 4 | 0.2 | 397 (2EA short) | X |
| 5 | 15 | 22 | 1.5 | 615 | X |
| 6 | 15 | 42 | 2.8 | 917 | X |
| 7 | 15 | 63 | 4.2 | More than 1000 V | ○ |
| 8 | 15 | 88 | 5.9 | More than 1000 V | ○ |
| 9 | 20 | 18 | 0.9 | 688 | X |
| 10 | 20 | 39 | 2.0 | 934 | X |
| 11 | 20 | 83 | 4.2 | More than 1000 V | ○ |
| 12 | 25 | 14 | 0.6 | 606 | X |
| 13 | 25 | 45 | 1.8 | 953 | X |

Referring to Table 1, in samples 1 to 2, 4 to 6, 9 to 10, and 12 to 13, in which G2/G1 was less than 4.0, damage did not occur inside the MLCC.

On the other hand, in samples 3, 7 to 8 and 11, in which G2/G1 was 4.0 or more, the turn-on voltage was 1000V or more, an electric shock protection function did not function, and the damage occurred inside the MLCC.

Further, a short-circuit occurred in sample 4, in which G2/G1 was 0.2.

In addition, in this case, the turn-on voltage was 397V, which was less than 400V.

In general capacitors, the chip may be damaged by excessive application of ESD when the TOV is less than 400V.

That is, when the TOV is 400V or more in the MLCC, the turn-on is possible, and the effectiveness of protecting the high voltage flowing through the lead electrode may be reduced.

Thus, a preferable TOV becomes 400 V or more.

That is, according to Table 1, a preferable numerical range of G2/G1 in the present exemplary embodiment satisfied G2/G1<4.0 and, more preferably, 0.2<G2/G1<4.0.

Figure 3:
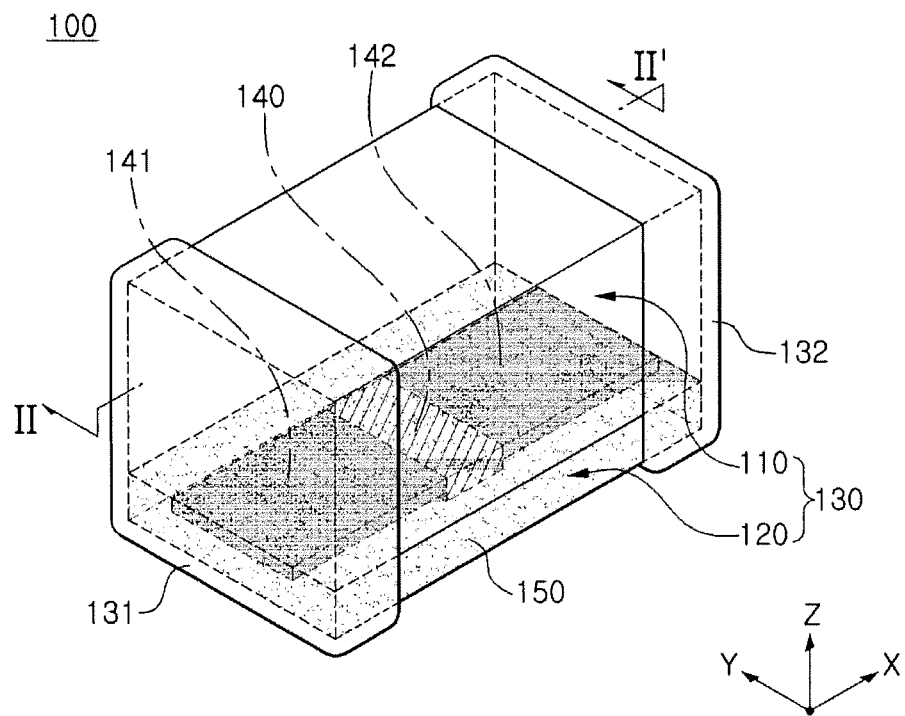
FIG. 3 is a transparent perspective view schematically illustrating a composite electronic component according to a second exemplary embodiment of the present disclosure.
Figure 4:
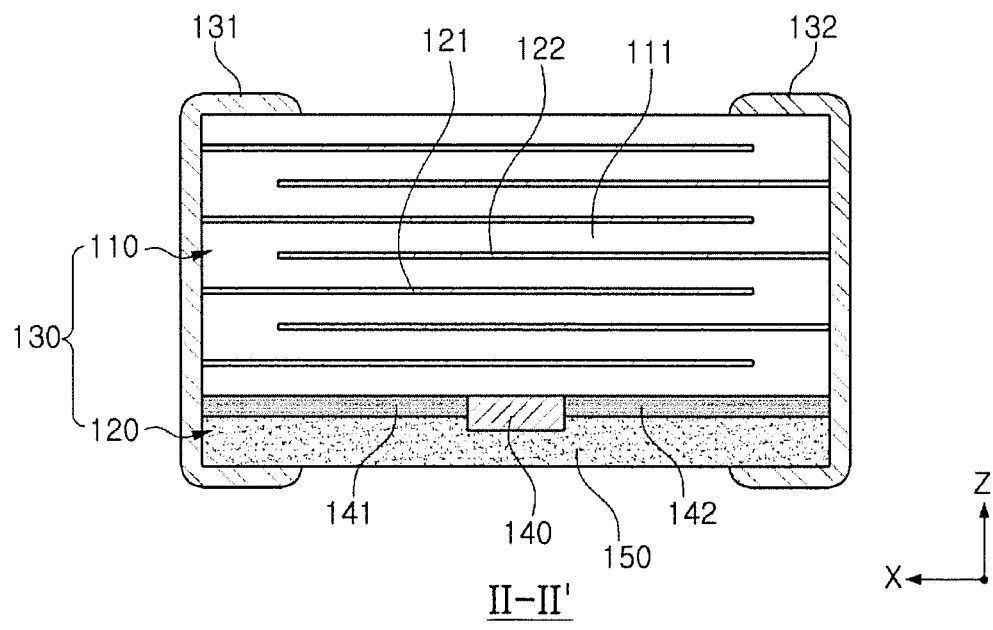
FIG. 4 is a cross-sectional view taken along line II-II' of FIG. 3.

FIG. 3 is a transparent perspective view schematically illustrating a composite electronic component according to a second exemplary embodiment of the present disclosure, and FIG. 4 is a cross-sectional view taken along line II-II' of FIG. 3.

In order to avoid overlapping descriptions, a detailed description of features of the composite electronic component 100 according to the second exemplary embodiment of the present disclosure which are the same as those of the composite electronic component according to the first exemplary embodiment of the present disclosure described above will be omitted.

Referring to FIGS. 3 and 4, the composite electronic component 100 according to the second exemplary embodiment of the present disclosure has a form in which the ESD protection device 120 is disposed on a lower surface of the body of the capacitor 110, in addition to the features of the composite electronic component according to the first exemplary embodiment of the present disclosure.

The ESD protection device 120 may be the ESD suppressor, but is not necessarily limited thereto.

Accordingly, vibration of the capacitor due to inverse piezoelectricity of the capacitor 110 may be prevented from being transmitted to the circuit board, such that acoustic noise may be reduced.

Unlike in the related art, the composite electronic component according to the exemplary embodiment of the present disclosure may include the capacitor 110 and the ESD protection device 120 coupled to each other, such that the distance between the capacitor 110 and the ESD protection device 120 may be designed to be a significantly reduced distance, whereby the noise may be reduced.

Further, since the capacitor 110 and the ESD protection device 120 are coupled to each other, the mounted area in the signal interface, the IC block, or the communication line may be significantly reduced, to excellently secure a reduced mounted space. In addition, a cost required for mounting the component may be reduced.

Board Having Composite Electronic Component

Figure 5:
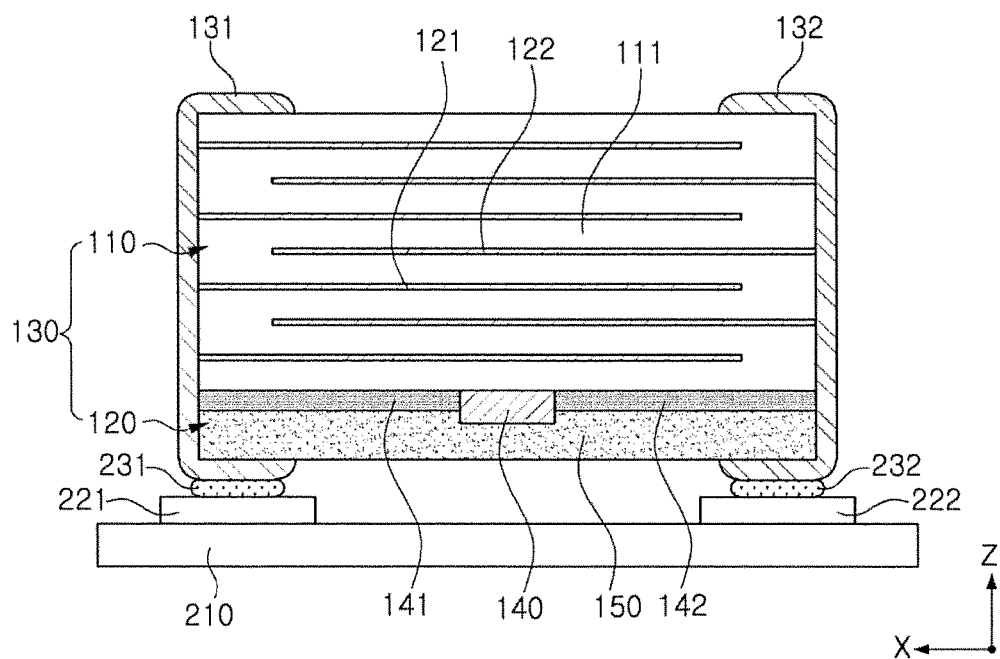
FIG. 5 is a perspective view illustrating a state in which the composite electronic component of FIG. 3 is mounted on a circuit board.

FIG. 5 is a perspective view illustrating a state in which the composite electronic component of FIG. 3 is mounted on a circuit board.

Referring to FIG. 5, a board having the composite electronic component 100 according to the present exemplary embodiment of the present disclosure may include: a circuit board 210 on which the composite electronic component 100 is mounted, and two electrode pads 221 and 222 formed on an upper surface of the circuit board 210. The circuit board may be a printed circuit board (PCB), and the like.

The electrode pads 221 and 222 may include first and second lead electrode pads 221 and 222 connected to the input terminal 131 and the ground terminal 132 of the composite electronic component 100, respectively.

Here, the input terminal 131 and the ground terminal 132 of the composite electronic component 100 may be electrically connected to the circuit board 210 by solders 231 and 232 in a state in which the input terminal 131 and the ground terminal 132 are in contact with the first and second lead electrode pads 221 and 222, respectively.

When a voltage is applied in a state in which the multilayer ceramic capacitor 100 is mounted on the circuit board 210 as described above, the acoustic noise may occur.

Here, a size of the first and second lead electrode pads 221 and 222 may be an indicator determining a number of the solders 231 and 232 connecting the input terminal 131 and the ground terminal 132 of the composite electronic component 100 and the first and second lead electrode pads 221 and 222 to each other, and a size of the acoustic noise may be adjusted according to the number of the solders 231 and 232.

Meanwhile, when a voltage having a different polarity is applied to the input terminal 131 and the ground terminal 132 formed on opposite surfaces of the composite electronic component 100 in a length direction, while the composite electronic component 100 is mounted on the circuit board 210, the body may be expanded and contracted in a thickness direction, due to an inverse piezoelectric effect of the dielectric layer 111, and opposite side surface parts of the input terminal 131 and the ground terminal 132 may be contracted and expanded in contrary to expansion and contraction of the body in the thickness direction, due to a Poisson effect.

Here, in the composite electronic component according to an exemplary embodiment of the present disclosure, the ESD protection device may be disposed on a lower surface of the capacitor, and when the composite electronic component is mounted on the circuit board, the vibration of the capacitor due to the inverse piezoelectricity of the capacitor may be prevented from being transmitted to the circuit board, such that the acoustic noise may be reduced.

In addition, in the composite electronic component according to an exemplary embodiment of the present disclosure, the ESD protection device may be disposed on the lower surface of the capacitor, such that even though cracks, or the like, occur in the composite electronic component, the capacitor may be protected since it is disposed at a distance from the circuit board.

In addition, in the composite electronic component according to an exemplary embodiment of the present disclosure, the ESD protection device may be disposed on the lower surface of the capacitor, such that a distance between the ESD protection device and the circuit board may be shortened, to reduce parasitic pattern resistance and parasitic inductance, thereby reducing a side effect.

That is, the parasitic pattern resistance and the parasitic inductance may be reduced, to improve frequency characteristics. In addition, the noise component may be filtered due to there being no signal distortion, and characteristics of the composite electronic component bypassing a portion of the overvoltage of the rated voltage or more may be improved.

As set forth above, according to the exemplary embodiments in the present disclosure, the composite electronic component in which the component mounted area may be reduced, while using electrostatic discharge (ESD), may be provided.

While the present invention has been shown and described in connection with the embodiments, it will be apparent to those skilled in the art that modifications and variations can be made without departing from the spirit and scope of the invention, as defined by the appended claims.

What is claimed is:

1. A composite electronic component comprising:
a composite body in which a capacitor and an electrostatic discharge (ESD) protection device are coupled to each other,
the capacitor including a body in which a plurality of dielectric layers and internal electrodes facing each other, with the dielectric layers interposed therebetween, are stacked, and
the ESD protection device including first and second lead electrodes disposed on the body of the capacitor, a discharge part disposed between the first and second lead electrodes, and a protection layer disposed on the first and second lead electrodes and the discharge part;
an input terminal connected to the internal electrodes of the capacitor and the first lead electrode of the ESD protection device; and
a ground terminal connected to the internal electrodes of the capacitor and the second lead electrode of the ESD protection device,
wherein G2/G1<4.0, in which G1 is a distance, in a stacking direction of the internal electrodes, between the internal electrodes adjacent to each other and G2 is a distance, in a direction perpendicular to the stacking direction, between the first and second lead electrodes.

2. The composite electronic component of claim 1, wherein 0.2<G2/G1<4.0.

3. The composite electronic component of claim 1, wherein the ESD protection device is disposed on a lower surface of the capacitor body.

4. The composite electronic component of claim 1, wherein the first and second lead electrodes face each other on the same plane.

5. The composite electronic component of claim 1, wherein the discharge part includes a conductive polymer.

6. The composite electronic component of claim 1, wherein the protection layer includes an epoxy-based resin.

7. The composite electronic component of claim 1, wherein the composite body includes first and second surfaces opposing each other, third and fourth surfaces connected to the first and second surfaces and opposing each other, and fifth and sixth surfaces connected to the first and second surfaces, connected to the third and fourth surfaces, and opposing each other,
the internal electrodes include first and second internal electrodes alternately stacked to be exposed through the third and fourth surfaces of the composite body, respectively,
the input terminal is disposed on the third surface of the composite body and is connected to the first internal electrodes and the first lead electrode of the ESD protection device, and
the ground terminal is disposed on the fourth surface of the composite body and is connected to the second internal electrodes and the second lead electrode of the ESD protection device.

8. The composite electronic component of claim 1, wherein a plating layer is disposed on the input terminal and the ground terminal.

9. A board having a composite electronic component comprising:
a circuit board having a plurality of electrode pads formed on an upper part thereof;
the composite electronic component of claim 1 mounted on the circuit board; and
a solder connecting the electrode pads and the composite electronic component.

10. The board having a composite electronic component of claim 9, wherein the ESD protection device is disposed between the solder and the capacitor of the composite electronic component.

11. The composite electronic component of claim 1, wherein the first and second lead electrodes and the discharge part are disposed directly on a same surface of the capacitor.

* * * * *